United States Patent [19]

Havemann et al.

[11] Patent Number: 4,788,160

[45] Date of Patent: Nov. 29, 1988

[54] PROCESS FOR FORMATION OF SHALLOW SILICIDED JUNCTIONS

[75] Inventors: Robert H. Havemann, Garland; Roger A. Haken; Thomas E. Tang, both of Dallas; Che-Chia Wei, Plano, all of Tex.

[73] Assignee: Texas Instruments Incorporated, Dallas, Tex.

[21] Appl. No.: 32,836

[22] Filed: Mar. 31, 1987

[51] Int. Cl.$^4$ .......................................... H01L 21/265
[52] U.S. Cl. ..................... 437/200; 437/44; 437/30; 437/931; 437/192; 148/DIG. 105; 148/DIG. 147
[58] Field of Search .................... 437/41, 40, 200, 178, 437/931, 192, 29, 27, 44, 30; 148/DIG. 105, DIG. 147

[56] References Cited

U.S. PATENT DOCUMENTS

| | | | |
|---|---|---|---|
| 4,259,680 | 3/1981 | Lepselter et al. | 357/35 |
| 4,339,869 | 7/1982 | Reihl et al. | 437/200 X |
| 4,450,620 | 5/1984 | Fuls et al. | 29/571 |
| 4,505,027 | 3/1985 | Schwabe et al. | 29/577 C |
| 4,558,507 | 12/1985 | Okabayashi et al. | 29/571 |
| 4,597,163 | 7/1986 | Tsang | 29/576 B |

OTHER PUBLICATIONS

H. Okabayashi et al., "Low Remittance MOS . . . ", IEDM 1982, pp. 556-559.

Primary Examiner—Brian E. Hearn
Assistant Examiner—T. N. Quach
Attorney, Agent, or Firm—Rodney M. Anderson; Leo N. Heiting; Melvin Sharp

[57] ABSTRACT

A process for forming shallow silicided junctions includes the step of sputtering a layer of titanium (28) over a moat region to cover a gate electrode (18) and a sidewall oxide (22) formed on the sidewalls of the gate electrode (18). The titanium is reacted with exposed silicon regions (24) and (26) to form silicide layers (30) and (32) and then dopant impurities are implanted into the substrate (10) prior to stripping the unreacted titanium. The unreacted titanium (36), (38), or (40) functions as a mask to both offset the implanted regions from the channel region (20) under the gate electrode (18) and also to prevent impurities from entering the substrate at regions outside the defined moat region.

28 Claims, 2 Drawing Sheets

PROCESS FOR FORMATION OF SHALLOW SILICIDED JUNCTIONS

CROSS REFERENCE TO RELATED APPLICATIONS

U.S. patent applications Ser. No. 45,978, filed May 1, 1987 and Ser. No. 57,871, filed June 2, 1987, disclose related subject matter. These cross-referenced applications are assigned to the assignee of the present application.

TECHNICAL FIELD OF THE INVENTION

The present invention pertains in general to the formation of shallow semiconductor junctions and, more particularly, to the formation of shallow source/drain junctions using a silicide layer to decrease resistivity.

BACKGROUND OF THE INVENTION

As integrated circuitry technology advances, the demand for increased packing density increases. High packing density is usually obtained through device shrinkage, which requires highly sophisticated processing techniques such as E-beam lithography, reactive ion etching, transient annealings, etc. Primarily, VLSI applications realize packing density through scaling down of device dimensions. In the planar dimension, the width and length of the various components are decreased to accommodate this density increase. In addition, the depth of the various structures such as oxides, impurity implants and metal interconnects must also be accounted for and a dimensional adjustment mode to insure proper operational characteristics.

In order to increase packing density for VLSI applications, it is necessary to decrease sheet resistance for the various conductive layers and also to reduce junction leakage current and impurity depth profiles for the various semiconductor junctions, such as the source/drain regions of the integrated circuit. To reduce sheet resistance over a semiconductor junction, one technique that is utilized is to silicide the surface by first depositing a refractory metal and then reacting it with the underlying silicon to form a silicide. The junctions are then formed by either implanting through the silicide after formation thereof or implanting prior to formation thereof. However, the higher reaction temperatures required to form the silicided junctions can present problems with respect to the integrity of the junction due to such things as segregation at the interface between the source/drain junction and the silicide layer, lateral straggle of the junction, etc. In addition, the silicide process and the implant process utilized to form the silicid.ed junction must be integrated into a given process flow without unduly complicating the process or unduly increasing the number of thermal cycles required for the overall process. Any increase in the number of thermal cycles may be a detriment to the performance of the device.

SUMMARY OF THE INVENTION

The present invention disclosed and claimed herein comprises a method for forming shallow silicided source/drain junctions. The method includes the steps of first forming an active area in a silicon substrate and then forming a gate electrode over the active area having a top surface and sidewalls. A layer of refractory metal is then formed over the active area and the gate electrode and then reacted to form a silicide where the refractory metal layer contacts silicon. Impurities are then implanted through the surface of the silicide followed by removal of the unsilicided portions of the refractory metal layer. The impurities are then driven down into the substrate to form a metallurgical junction in the silicon beneath the silicide layer.

In another embodiment of the present invention, the gate electrode is formed from polycrystalline silicon and is patterned to form an electrode. A layer of oxide is formed on the sidewalls of the gate electrode by first forming a conformal layer of oxide and then anisotropically removing the oxide layer except for that portion contacting the sidewalls of the gate electrode.

In yet another embodiment of the present invention, there are a plurality of active areas formed, the active areas separated by regions of thick field oxide. The refractory metal acts as a mask between the intersection of the field oxide and the active area to prevent impurities from entering this intersection.

In a further embodiment of the present invention, a light dosage of impurities of the second conductivity type are implanted into the substrate prior to formation of the refractory metal layer and following formation of the gate electrode.

The process of implanting dopant impurities into the sputtered on layer of refractory metal prior to removing the unsilicided portions thereof provides a technical advantage of offsetting the implanted impurities from the channel region that is defined by the gate electrode. An additional technical advantage is provided in that increased isolation is realized between adjacent transistors due to the presence of unsilicided titanium outside of the moat regions, which prevents passage of implanted dopant impurity materials into regions of the substrate outside of the desired implanted regions. This unsilicided portion of the refractory metal layer functions as a mask.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
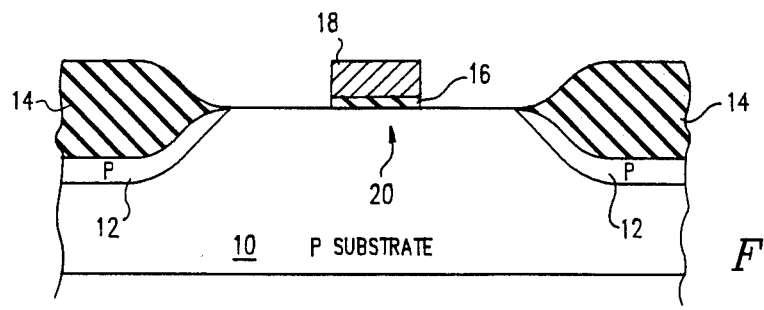
FIG. 1 illustrates a cross-sectional view of the silicon substrate after patterning the moat region and the first layer of poly gates.

Referring now to FIG. 1, there is illustrated a cross-sectional diagram of one step in the fabrication process for a typical transistor having a gate, source and a drain. For simplicity purposes, only an NMOS process is being illustrated. However, it should be understood that the hereinbelow described process steps can be applied equally to processing of PMOS devices and CMOS devices with minor modifications.

In conventional fabrication of NMOS integrated circuits, a thin wafer of p-type semiconductor material, such as that identified by reference numeral 10 in FIG. 1, is first covered by an oxide/nitrid layer. These layers are then patterned to define an area thereunder into which conductivity affecting impurities are to be diffused to form the active region and this is termed a "moat". P-type impurities are then implanted into the portions of the substrate outside of the moat region to form a channel stop or isolation region. These are referred to by the reference number 12. The substrate 10 is then subjected to a steam oxidation step at approximately 900° C. to form a surface insulating layer 14, referred to as a field oxide layer. This creates a layer of sufficient thickness so that later, when the thin layers of metallization are applied, any electric fields developed in normal operation of the devices are insufficient to adversely affect operation of those portions of the semiconductor element, other than those where the insulating layer is intentionally thinned. The nitride cap is then removed and the gate electrode of the transistor formed.

The gate electrode of the transistor is formed by first forming a dummy gate oxide to a thickness of approximately 250 angstroms over the moat region between the field oxide layers 14. A light threshold implant of P-type impurities is then made into the moat region followed by removal of the dummy gate oxide and subsequent growth of a gate oxide layer 16. A layer of polycrystalline silicon is then deposited on the substrate 10 and patterned to form a gate electrode 18 over the gate oxide layer 16, the gate electrode 18 defining a channel region 20 in the semiconductor substrate 10 directly below the gate electrode 18.

The above process is identical for CMOS and PMOS devices with the exception that in CMOS processing, wells of opposite conductivity type must be defined, these opposite conductivity type wells utilized to form the opposite conductivity type transistors. This requires an additional implant step in the front end of the process to define the well and an additional annealing step to drive the well to the proper depth. This is done prior to patterning and formation of the moat region and the field oxide layer 14.

Figure 2:
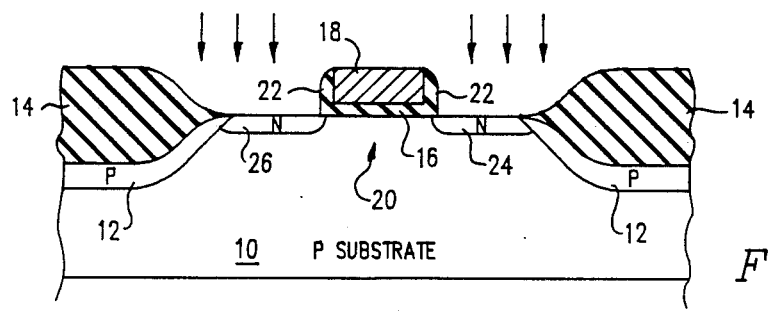
FIG. 2 illustrates a cross-sectional view after formation of the sidewall oxide and implantation of the shallow source/drain extension.

Referring now to FIG. 2 there is illustrated a cross-sectional view of the next step in the process. In the step illustrated in FIG. 2, a conformal layer of LPCVD oxide is either deposited or grown on the substrate 10 to a thickness of approximately 300 angstroms. This layer is then subjected to an anisotropic etch to clear the oxide from flat surfaces. This etch leaves a sidewall oxide 22 on either side of gate electrode 18, which is approximately 300 angstroms in thickness. The purpose of sidewall oxide layers 22 is to seal the side or vertical surfaces of the gate electrode 18, as will be more clearly described herein below. The process for forming sidewall oxides is described in U.S. Pat. No. 4,356,040, issued to Horng-Sen Fu et. al. on Oct. 26, 1982 and assigned to Texas Instruments, Inc.

After forming the sidewall oxide layers 22, a source/drain extension implant is formed by lightly implanting phosphorus into the exposed regions of the moat. The phosphorus is implanted to a dosage of approximately $2 \times 10^{13}$ cm$^{-2}$ to provide an n-type region in the p-type substrate 10. The polycrystalline silicon material forming the gate electrode 18 and the sidewall oxide layers 22, in addition to the field oxide layers 14, effectively mask off all regions outside the moat and the channel region 20, This results in an n-type source/drain extension implant 24 being formed on one side of the gate electrode 18 and a source/drain extension implant 26 being formed on the other side of gate electrode 18. This is termed a self aligned process. It is important to note that the thickness of the sidewall oxide 22 performs a spacing function to separate the edge of the source/drain extension implants 24 and 26 away from the channel region 20. Subsequent processing steps and the associated thermal cycles result in some lateral "straggle" which essentially results in migration of the n-type impurity in the source/drain extension implants 24 and 26 toward the channel region 20. It is important from the standpoint of device operation that the edges of the source/drain extension implants 24 and 26 do not extend into the channel region 20 and under the gate electrode 18 but as close as possible thereto.

It is possible that source/drain extension implants 24 and 26 can be formed prior to formation of the sidewall oxide layers 22. This is the conventional process which can be easily implemented in the present device. However, by forming the source/drain extension implants 24 and 26 after formation of the sidewall oxide 22, an additional spacing of 300 angstroms is achieved, which spacing will be reduced by some percentage after subsequent thermal cycling.

Figure 3:
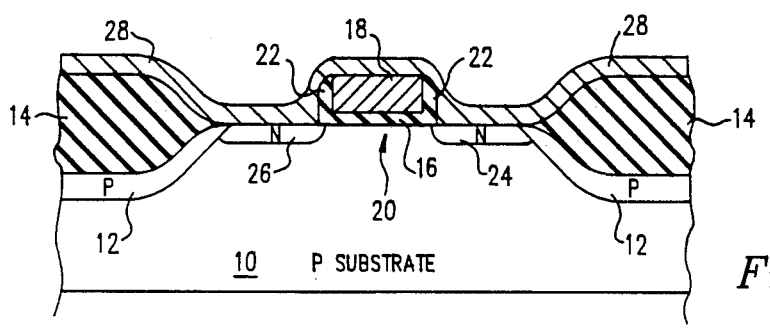
FIG. 3 illustrates a cross-sectional view of the substrate after sputtering on of the titanium layer.

After forming the source/drain extension implants 24 and 26, a layer 28 of titanium which is a refractory metal is sputtered onto the top of the substrate in a vacuum apparatus to a thickness of approximately 1000 angstroms, as illustrated in FIG. 3. This is a conformal layer that will overlie the exposed polysilicon upper surface of the control electrode 18, the exposed silicon surface over the source/drain extension implants 24 and 26, the sidewall oxides 22 and the surface of the field oxide layers. Typically, sputtering of the titanium layer 28 is preceded by a wet etch in 1.0% hydrochloric acid to insure that no residual oxide remains on the upper surface of the gate electrode 18 and the upper surface of the moat where the source/drain extension implants 24 and 26 are formed.

After formation of the titanium layer 28, the titanium is reacted at a temperature of approximately 675° C. and in an atmosphere of argon and nitrogen for approximately thirty minutes This reaction allows the portion of the titanium layer 28 that is adjacent the silicon in the moat forming the source/drain extension implants 24 and 26 and the portion of the titanium layer 28 adjacent the exposed upper surface of the gate electrode 18 to consume silicon or polysilicon to form titanium disilicide. The titanium disilicide is a refractory material. This results in a thickness of titanium disilicide of approximately 1500 angstroms. A silicide layer 30 is therefore formed over the source/drain extension implant 24 in addition to a silicide layer 32 being formed over the source/drain extension implat 26 and a silicide layer 34 being formed on the top surface of the gate electrode 1S. The silicide layers 30 and 32 consume a portion of the doped silicon that formed portions of the source/drain extension implants 24 and 26, thus decreasing the effective width thereof.

The original titanium layer 28 is converted to titanium disilicide only in the silicide layers 30, 32 and 34. Only portions of the titanium layer 28 remain. These are portions 36 which overlie the field oxide layer 14 and a portion 38 which overlies the sidewall oxide layer 22 adjacent the silicide layer 30 and a portion 40 which overlies the sidewall oxide layer 22 adjacent the silicide layer 32. Since the titanium was reacted in an argon and nitrogen atmosphere, a portion of the exposed surface of the titanium in regions 36, 38 and 40 will be converted to titanium nitride. In addition, the portion of the unsilicided titanium adjacent the field oxide or sidewall oxides will be converted to titanium oxide.

After the titanium is reacted with the silicon to form titanium disilicide, and implant step is performed to implant n-type impurities through the surface and into the silicide. As will be described hereinbelow, these impurities are then diffused downward into the substrate to form the source/drain junctions below the source/drain extension implants 24 and 26. The implant can be any basic source/drain implant and, in the preferred embodiment, the implant uses a two stage implant where arsenic is first implanted followed by a phosphorus implant.

The arsenic implant is a basic doubly charged implant with a voltage of between 125-180 Kev to a dosage of $6 \times 10^{15}$ cm$^{-2}$. Phosphorus is then implanted with a voltage of 110-180 Kev to a dose of $4 \times 10^{14}$ cm$^{-2}$. Alternately, phosphorus alone can be implanted at a dosage of approximately $3 \times 10^{15}$ ions/cm$^2$ at a voltage of 110-180 Kev. Although the voltages may vary, the object is to place the peak of the dopant profile after implantation at a predetermined depth from the surface of the silicide layers 30 and 32. In the preferred embodiment, this peak is placed as close to the junction formed between the silicide layers 30 and 32 and the source/drain extension implants 24 and 26, respectively. However, the dopant can be placed at any point within the silicide or in the substrate beneath the silicide. Upon a subsequent annealing step, this dopant diffuses downward into the substrate to form the source and drain junctions. If a CMOS process were utilized, this would require alternately masking off of the n- and p-channel devices and providing an additional implant of p-type impurities into the p-channel devices.

After implanting the n-type impurities into the silicide layers 30 and 32, the substrate is then patterned and etched to remove the unsilicided and unpatterned portions of the titanium layer 28 without affecting the titanium disilicide. For example, a suitable wet etch is a solution of H$_2$SO$_4$ and H$_2$O$_2$. Since titanium only reacts with silicon or polycrystalline silicon to form a silicide, the portions 36 covering the field oxide layer 14 and the portions 38 and 40 of the original titanium layer 28 covering the sidewall oxide regions 22 will have the unsilicided titanium removed therefrom. The wet etch will attack both titanium nitride and titanium oxide, such that no conductive layer remains behind other than titanium disilicide. The titanium disilicide process is described in U.S. Pat. No. 4,545,116 issued to C. K. Lau on Oct. 8, 1985, assigned to Texas Instruments, Inc.

Although the above process was described utilizing a sidewall oxide to prevent formation of titanium disilicide on the sidewalls of the gate electrode 18, this step can be eliminated if the refractory metal layer is sputtered on to a thickness that approximates that of the gate oxide layer 16. This would result in titanium oxide being formed on the sidewalls of the gate oxide layer 16, which would be removed with the titanium nitride with the wet etch. It is only important that a short not be formed between the gate electrode 18 and the source and drain junctions, and formation of titanium oxide at the sidewalls of the gate oxide layer will facilitate this, provided the refractory metal layer is not so thick as to form a silicide between the source or drain on the sidewalls of the gate electrode 18.

The patterning of the reacted titanium layer 66 provides for the formation of local interconnects from the titanium nitride. A first local interconnect 45 is formed having one end thereof connected to the silicide layer 30 and the other end overlying the field oxide layer 14 adjacent silicide layer 30. A second local interconnect 47 is formed having one end thereof connected to the silicide layer 32 and the other end thereof overlying the field oxide layer 14 adjacent silicide layer 32.

After the impurities are implanted into the silicide layers 30 and 32 and the unreacted titanium removed, the substrate is then annealed for thirty minutes at a temperature of approximately 800° C. in an atmosphere of argon to stabilize and further lower the resistivity of the titanium disilicide. Titanium disilicide increases the conductivity of all silicon areas over which it was formed and constitutes a self-aligned process. In addition, the impurities are driven down into the silicon of substrate 10 to form a metallurgical junction beneath the silicide layers 30 and 32.

The patterning of the reacted titanium layer 66 provides for the formation of local interconnects from the titanium nitride. A first local interconnect 45 is formed having one end thereof connected to the silicide layer 30 and the other end overlying the field oxide layer 14 adjacent silicide layer 30. A second local interconnect 47 is formed having one end thereof connected to the silicide layer 32 and the other end thereof overlying the field oxide layer 14 adjacent silicide layer 32.

When the dopant that was originally implanted into the silicide layers 30 and 32 adjacent the lowermost junction is diffused outward and downward into the substrate by the annealing step, there will be diffusion in two directions. The first direction will be downward into the substrate and the second direction will be lateral. The downward diffusion is termed the "depth". In the preferred embodiment, and after all thermal cycling in the substrate is complete, this will result in a junction which is approximately 1500 angstroms deep with a lateral diffusion of approximately 100 angstroms. This forms an n+ region 42 beneath the silicide layer 30 to provide one of the source/drain regions and an n+ region 44 beneath the silicide layer 32 to provide the other of the source/drain regions.

Although the impurities were implanted into the silicided layers 30 and 32 after formation thereof, an alternate method to implant the impurities would be to implant them prior to formation of the silicide layers 30 and 32. This is illustrated in FIG. 3 with phantom arrows oriented downward toward the substrate. Once the impurities are implanted into the titanium layer 28, the titanium layer 28 is then reacted to form the silicide layers 30 an 32. Since this reaction occurs at 675° C. this reaction would provide some downward diffusion of the impurities into the substrate to form the source/drain junctions 42 and 44. The annealing step could be utilized to more clearly define the junctions. However, it may be possible to shorten the duration of time that the substrate must be annealed to form adequate junctions.

Figure 5:
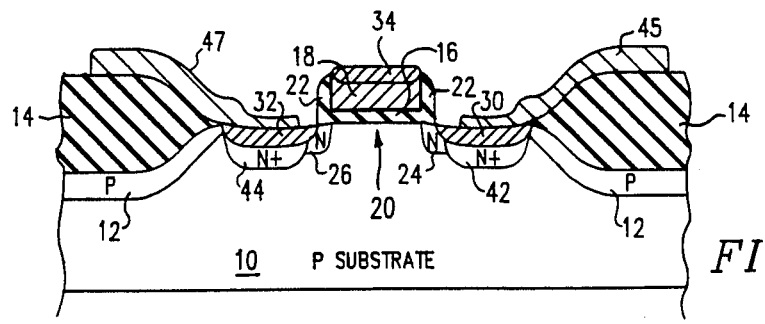
FIG. 5 illustrates a cross-sectional view of the substrate after removal of the unsilicided and unpatterned titanium and annealing of the junction.
Figure 5A:
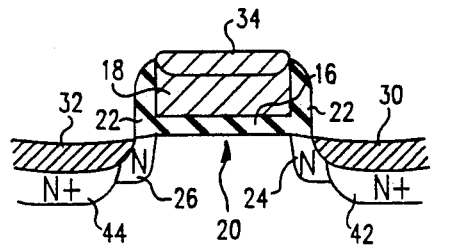
FIG. 5a illustrates a detail of the silicided junction in FIG. 5 adjacent the channel region under the gate of the transistor.
Figure 6:
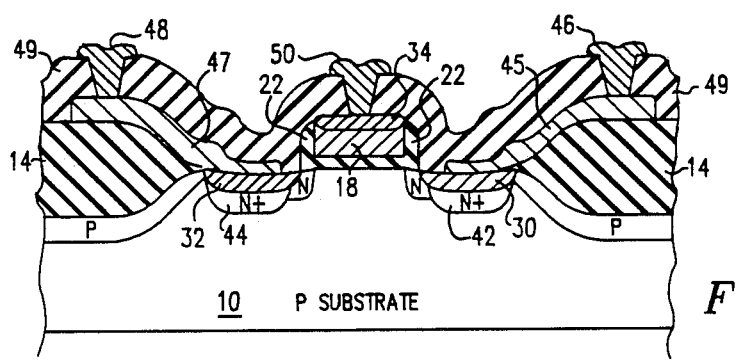
FIG. 6 illustrates a cross-sectional view of the substrate after formation of the interlevel oxide and contacts.

Referring now to FIG. 5a, there is illustrated an expanded view of the channel region 20 and the n+ region 44. It can be seen that the silicide layer 32 is offset from the channel region 20. The offset is a matter of design choice, which is determined by the thickness of the sidewall oxide layers 22, to account for the lateral diffusion of the implanted region 44. The n-type source/drain extension implant 26, described above, is provided to make contact with the channel region 20. Since this is a light implant, it is more controllable and will provide a more clearly defined boundary between the conductive source and drain regions and the channel regions, and will be more closely aligned with the edge of the channel region. However, the source/drain extension implant 26 can be eliminated since the offset of the edge of the n+ region 44 can be adjusted by the thickness of the sidewall oxide layer 22 and the thickness of the titanium layer 28, which was originally sputtered onto the substrate.

The distance between the edge of the n+ region 44 and the edge of channel region 20 is equal to the thickness of the sidewall oxide layer 22 plus the thickness of the titanium layer 28 less the lateral diffusion of the implant region 44. In the preferred embodiment, the titanium layer is approximately 1000 angstroms thick, the sidewall oxide 22 approximately 300 angstroms thick and the lateral diffusion approximately 1000 angstroms. This would result in the edge of the source/drain region 44 being nominally aligned with the edge of the channel region 20 approximately 300 angstroms, which is approximately equal to the lateral straggle of the implant. If the thickness of the sidewall oxide is decreased and the thickness of the titanium layer 28 is also decreased, this dimension can also be decreased. Further, a longer thermal cycle in the annealing step, although undesirable, will also cause this distance to decrease.

After the source/drain junctions 42 and 44 are formed, an interlevel 49 of oxide is deposited onto the substrate for isolation and contact holes formed therethrough to make contact with the silicided source/drain regions 30 and 32 through interconnects 45 and 47, respectively, and the silicided gate region 34. Contacts 46 and 48 are then formed through the contact holes to the local interconnects 45 and 47, respectively, and a contact 50 formed through the interlevel oxide 49 to the silicide layer 34 on top of the gate electrode 18. Although not shown, subsequent metallization steps for interconnects are then performed to complete the integrated circuit.

Figure 4:
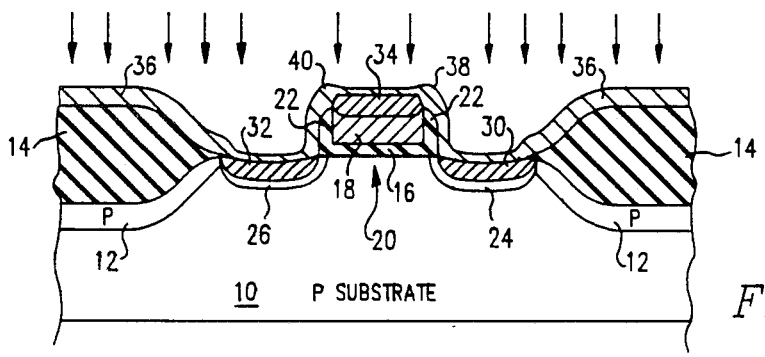
FIG. 4 illustrates a cross-sectional view after reaction of the titanium to form titanium disilicide and implanting of n-type impurities through the surface of the silicide.
Figure 7A:
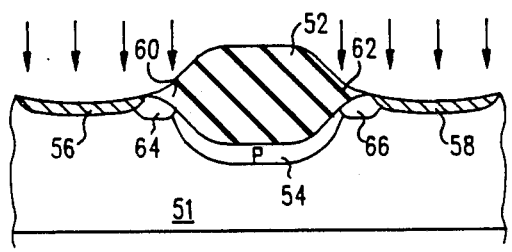
FIG. 7a illustrates a cross-sectional view of a substrate utilizing a prior art method for implanting silicided junctions.
Figure 7B:
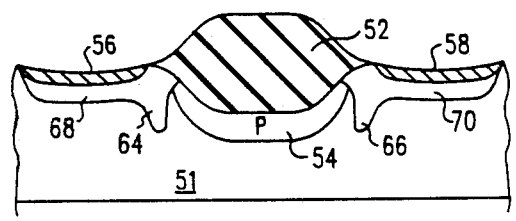
FIG. 7b illustrates a cross-sectional view of the substrate of FIG. 7a in the prior art method after annealing to form the silicided junction.

Referring now to FIGS. 7a and 7b, there are illustrated cross-sectional views of a substrate illustrating the processing steps for the prior art process wherein unreacted titanium is removed prior to the implanting step which corresponds to the processing stage of FIGS. 3 and 4. In FIG. 7a, there is illustrated a layer of field oxide 52 having a channel stop 54 formed below it. A silicide layer 56 is formed on one side of the field oxide layer 52 and a silicide layer 58 formed on the other side. It should be understood that the silicide layers 56 and 58 are formed in two moats that are separated by the field oxide layer 52, the silicide layers 56 and 58 defining the regions in which the source/drain of two different transistors will be formed.

After formation of the silicide layers 56 and 58, the unreacted titanium layer is removed. This is where the process differs from the process depicted in FIG. 3 and the process depicted in FIG. 4. After the unreacted titanium is removed, the surface of the field oxide layer 52 is exposed. Thereafter, n-type impurities for a p-type substrate or p-type impurities for an n-type substrate are then implanted into the silicide layers 56 and 58, in a similar manner to the implant step illustrated in FIG. 4. As described above, the implant energy is adjusted such that the peak of the implant dopant profile is either centered in the silicide layers 56 and 58 or disposed proximate the junction of the silicide layers 56 and 58 with the silicon substrate 51. However, the field oxide layer 52 has a tapered region on either side thereof which is referred to as a "bird's beak." There is a bird's beak 60 adjacent the silicide layer 56 and a bird's beak 62 adjacent the silicide layer 58. Since this is a tapered surface and not a vertical wall, there is minimal blocking of the dopant atoms accelerated into the substrate during the ion implant process. This will result in some of the impurity atoms passing through the bird's beaks 60 and 62 to enter the silicon that lies thereunder. A resultant n+ layer 64 will be formed below the bird's beak 60 and a resultant n+ region 66 will be formed below the bird's beak 62.

After implantation, the process then proceeds as described above and the substrate is annealed to diffuse the dopant impurities implanted into the silicide layers 56 and 58 downward into the substrate, resulting in an n+ region 68 underlying the silicide layer 56 and are n+ region 70 underlying the silicide layer 58. The implanted regions 68 and 70 are similar to the n+ regions 42 and 44 of FIG. 5, in that they are essentially shallow junctions. However, due to the passage of dopant impurities through the bird's beaks 60 and 62, the n+ regions 64 and 66 are considerably deeper than junctions 68 and 70 due to increased diffusion. The result of this is that the difference between the edges of the regions 64 and 66, which constitutes the actual edges of the source/drain regions between adjacent transistors separated by the oxide layer 52, is decreased. This decrease in distance between the source/drain junctions in adjacent transistors effectively decreases the isolation. This results in a problem, since there is a potential that the channel stop 54 can be slightly depleted of dopants at the interface between the channel stop 54 and the oxide layer 52 due to segregation of impurities at the boundary. This can cause a very lightly doped region to be formed at the boundary which can form the channel of a transistor. When a metal gate or some interconnect is formed on the top of the oxide 52 (not shown), this can form a parasitic transistor. This parasitic transistor is an undesirable result which can be minimized by increasing the distance between the edges of the source/drain regions of adjacent transistors. By utilizing the process step whereby the implant is formed prior to the removing the unreacted refractory metal, the formation of the increased depth n+ regions 64 and 66 can be prevented. Therefore, the above described process increases isolation between adjacent transistors by increasing the distance between the edges of the shallow junction source/drains in adjacent transistors.

In summary, there has been provided a process whereby titanium is sputtered onto a substrate and reacted to form silicide layers over the source/drain regions and also the polysilicon conductors. A sidewall oxide is formed on vertical surfaces of the polysilicon gate prior to sputtering on of the titanium to prevent reaction of the titanium with the vertical walls of the poly gate electrodes in the transistors. Impurities are then implanted into the titanium disilicide prior to stripping off the unreacted titanium. This provides an offset from the edge of the channel region defined by the gate electrode due to unreacted titanium remaining on the sidewall oxide. In addition, the unreacted titanium also isolates regions outside the active areas to prevent dopant impurities from entering the silicon substrate in unwanted regions.

Although the preferred embodiment has been described in detail it should be understood that various changes, substitutions and alterations can be made therein without departing from the spirit and scope of the invention as defined by the appended claims.

What is claimed is:

1. A method for forming junctions in an integrated semiconductor device, comprising:
   providing a silicon substrate of a first conductivity type;
   forming active areas in the substrate separated by thick insulating oxide regions;
   forming polycrystalline gates on the surface of the active area separated therefrom by a layer of oxide to define a channel region;
   forming a conformal layer of refractory metal over the substrate;
   reacting the portions of the layer of refractory metal contacting the surface of the silicon in the substrate and the surface of the polysilicon in the gates to form corresponding layers of silicide of the refractory metal;
   implanting impurity materials of a second conductivity type through the surface of the layers of metal silicide;
   after said implanting removing the portions of the refractory metal layer not reacted to form silicide; and
   driving the impurity materials into the substrate to form a metallurgical junction beneath the silicide layers.

2. The method of claim 1 wherein the polycrystalline gate has a top surface and two essentially vertical surfaces and further comprising selectively forming a protective layer of oxide on the essentially vertical surfaces of the polysilicon gates prior to formation of the refractory metal layer to prevent the formation of silicide on the essentially vertical surfaces.

3. The method of claim 2, wherein the step of forming the protective layer of oxide comprises:
   depositing a layer of oxide to a predetermined thickness over the substrate; and
   anisotropically etching the oxide to remove all the oxide except on the surfaces essentially vertical to the surface of the silicon.

4. The method of claim 2 and further comprising implanting a light dosage of impurities of the second conductivity type into the substrate prior to forming the conformal layer of refractory material.

5. The method of claim 1 wherein the refractory metal comprises titanium and the silicide comprises titanium disilicide.

6. The method of claim 1 wherein the step of forming the layer of refractory metal comprises sputtering the refractory metal onto the substrate to a predetermined thickness.

7. The method of claim 1 wherein the step of implanting impurity materials through the surface of the silicide comprises implanting the impurity materials into the layer of silicide to a predetermined depth.

8. The method of claim 7 wherein the predetermined depth is proximate the boundary of the silicide layer and the silicon of the substrate.

9. The method of claim 1 wherein the step of driving the impurities into the substrate comprises annealing the substrate at a predetermined temperature for a predetermined amount of time.

10. The method of claim 1 wherein the step of removing the unsilicided refractory metal layer further comprises:
    patterning the unsilicided portions of the refractory metal layer; and
    inhibiting removal of the patterned portions of the refractory metal layer.

11. A method for forming semiconductor junctions in a silicon substrate, comprising:
    forming a region of a first conductivity type in the substrate;
    forming a conductive layer on the substrate having a top surface and a sidewall;
    forming a conformal layer of refractory metal on the substrate and the conductive layer;
    reacting the portion of the refractory metal contacting the surface of the silicon to form a silicide;
    implanting impurity materials of a second conductivity type through the surface of the silicide;
    after said implanting removing the portions of the refractory metal layer not reacted to form silicide; and
    driving the implanted impurities downward into the substrate to form a metallurgical junction between the first and second conductivity types beneath the silicide.

12. The method of claim 11 and further comprising:
    dividing the region of the first conductivity type into a plurality of active areas separated by thick oxide region; and
    pattering the conductive layer to form at least one electrode on at least one of the active regions having a top surface and sidewall regions.

13. The method of claim 11 wherein the conductive layer is comprised of a layer of polycrystalline silicon and the step of reacting the refractory metal layer results in a silicide formed on the surface of the polycrystalline silicon layer contacting the refractory metal layer.

14. The method of claim 11 wherein the conductive layer is comprised of polycrystalline silicon which forms a silicide when reacted with the refractory metal and further comprising forming a protective layer of oxide on the sidewalls of the conductive layer prior to formation of the refractory metal layer to prevent formation of silicide on the sidewalls.

15. The method of claim 14 wherein the step of forming the protective layer of oxide comprises:
    forming a conformal layer of oxide over the top surface and sidewalls of the conductive layer; and
    anisotropically removing the deposited layer of oxide except from the sidewalls of the conductive layer.

16. The method of claim 14 and further comprising implanting a light dosage of impurities of the second conductivity type into the substrate prior to the formation of the refractory metal layer.

17. The method of claim 11 wherein the refractory metal is comprised of titanium and the silicide is comprised of titanium disilicide.

18. The method of claim 11 wherein the step of implanting impurity materials through the surface of the silicide comprises implanting materials to a predetermined depth in the silicide.

19. The method of claim 18 wherein the majority of impurities are implanted to a point proximate the junction of the silicide and the silicon of the substrate.

20. The method of claim 11 wherein the step of removing the unsilicided portions of the refractory metal layer further comprises:
    patterning the unsilicided portions of the refractory metal layer; and
    inhibiting removal of the patterned portions of the refractory metal layer.

21. A method for forming a semiconductor device in a silicon substrate, comprising:
    forming a plurality of active areas on the substrate, each separated by a layer of thick field oxide;
    forming at least one gate electrode of polycrystalline silicon having a top surface and sidewalls on one of the active layers and separated from the surface of the silicon by a layer of gate oxide;
    selectively forming a layer of oxide on the sidewalls of the gate electrode;
    forming a conformal layer of refractory metal on the substrate;
    reacting the portions of the layer of refractory metal contacting the surface of the silicon and the top surface of the gate electrode to form a silicide;
    implanting impurity materials of a second conductivity type through the surface of the silicide to a first dosage;
    after said implanting removing the portions of the refractory metal layer not reacted to form a silicide; and
    driving the implanted impurities into the silicon to form a metallurgical junction between the first and second conductivity types beneath the silicide.

22. The method of claim 21 wherein the step of forming the layer of oxide on the sidewalls comprises:
    depositing a conformal layer of oxide over the substrate; and
    anisotropically removing the portions of the oxide layer except that portion formed on the sidewalls of the electrode.

23. The method of claim 21 wherein the refractory metal is titanium and the silicide is titanium disilicide.

24. The method of claim 21 wherein the step of implanting impurities comprises implanting the impurities into the silicide layer.

25. The method of claim 24 wherein the impurities are implanted proximate the junction between the silicide and the silicon on the substrate.

26. The method of claim 21 and further comprising implanting impurity materials of the second conductivity type to a second dosage lighter than the first dosage prior to forming the refractory metal layer and after formation of the electrode.

27. The method of claim 26 wherein the impurities at the second dose are implanted after formation of the oxide and the sidewalls of the gate electrode.

28. A method forming silicided source/drain regions in an MOS transistor having an active region formed on a substrate and a gate electrode disposed over the active region and separated therefrom by a layer of oxide to define a channel region, comprising:
    forming a sidewall oxide on the vertical surfaces of the gates;
    forming a layer of refractory metal over the substrate;
    reacting the refractory metal layer to form a silicide at the portions of the refractory metal layer contacting the silicon and the active regions on the opposite sides of the gate electrode;
    implanting impurities of a conductivity type opposite that of the substrate through the surface of silicided layers and the unsilicided portions of the refractory metal layer;
    after said implanting removing the unsilicided portions of the refractory metal layer; and
    driving the impurities down into the substrate.

* * * * *